United States Patent [19]

Pfeifer

[11] Patent Number: 4,814,233

[45] Date of Patent: Mar. 21, 1989

[54] MATERIAL COATED WITH POLYAMIC ACID ESTER

[75] Inventor: Josef Pfeifer, Therwil, Switzerland

[73] Assignee: Ciba-Geigy Corporation, Ardsley, N.Y.

[21] Appl. No.: 67,589

[22] Filed: Jun. 29, 1987

Related U.S. Application Data

[62] Division of Ser. No. 845,892, Mar. 28, 1986, Pat. No. 4,696,890.

[30] Foreign Application Priority Data

Apr. 11, 1985 [CH] Switzerland .......................... 1553/85

[51] Int. Cl.$^4$ .......................... B32B 27/00; G03C 5/00
[52] U.S. Cl. ..................................... 428/522; 428/463; 428/442; 428/702; 428/704; 428/1; 522/905; 522/904; 427/53.1; 427/54.1

[58] Field of Search ................ 428/500, 522; 430/325, 430/270, 18, 330; 522/905; 427/54.1, 53.1

[56] References Cited

U.S. PATENT DOCUMENTS

| | | | |
|---|---|---|---|
| 3,855,273 | 12/1974 | Bilow | 260/471 R |
| 4,331,249 | 12/1986 | Kalyanaraman | 430/325 |
| 4,629,777 | 12/1986 | Pfeifer | 430/325 |
| 4,696,890 | 9/1987 | Pfeifer | 430/325 |

Primary Examiner—P. C. Ives
Attorney, Agent, or Firm—Luther A. R. Hall

[57] ABSTRACT

A material to which there is applied a polyamic acid ester obtained from aromatic tri-or tetracarboxylic acids which contain benzophenone groups and organic diamines is suitable for producing protective coatings or relief images. After it has been irradiated, the material can be subjected to a heat treatment to convert the polyamic acid ester into the polyimide.

17 Claims, No Drawings

MATERIAL COATED WITH POLYAMIC ACID ESTER

This is a divisional of application Ser. No. 845,892, filed on Mar. 28, 1986, now U.S. Pat. No. 4,696,890, issued on Sept. 29, 1987.

The present invention relates to a coated material on a substrate, to at least one surface of which substrate a layer of a polyamic acid ester derived from aromatic benzophenonetri-or tetracarboxylic acids is applied, and to the use of said coated material for making protective insulating layers and relief images.

European published patent application EP-A-0 134 752 discloses coated materials which can be crosslinked by irradiation, the radiation sensitive layer of which materials can consist of a polyimide derived from benzophenonetetracarboxylic acid. Radiation sensitive polyimides are disclosed in published European patent application EP-A No. 0 138 768. Polyamic acid esters obtained from benzophenonetetracarboxylic acids are disclosed in U.S. Pat. No. 3,855,273 as materials for coating wire to produce an insulating layer of polyimides. It would be desirable to provide radiation-sensitivie precursors of such polyimides, as they are generally more readily soluble, which is an advantage in coating substrates.

The present invention relates to a coated material on a substrate, at least one surface of which substrate is coated with a layer of at least one polyamic acid ester, said polyamic acid ester comprising (a) 50 to 100 mol.%, based on the polyamic acid ester, of at least one recurring structural unit of formula I or II or a mixture thereof,

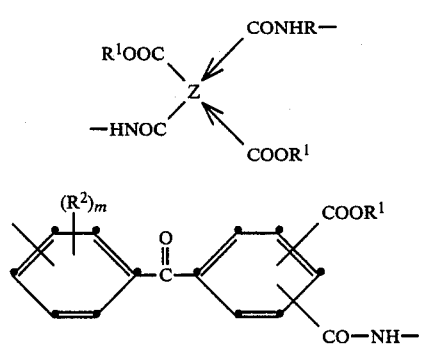

and (b) 0 to 50 mol.% of at least one recurring structural unit of formula III or IV or a mixture thereof

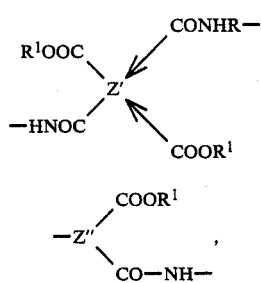

wherein the arrows denote position isomerism, Z is tetravalent phenyl-aromatic radical which contains a benzophenone structural unit and in which one of the ester groups and one of the amide groups in formula I are attached in the ortho-position either to one phenyl radical or to two different phenyl radicals, and the ester and amide groups in formula II are located in the ortho-position, Z' is a tetravalent aromatic radical which differs from Z and Z" is a trivalent aromatic radical which differs from the radical of formula II, wherein one ester group and one amide group are located in the ortho- or peri-position, R is an unsubstituted or substituted divalent organic radical, excluding diphenyloxyphenyl, $R^1$ is a saturated aliphatic hydrocarbon, and $R^2$ is a substituent, and m is 0 or an integer from 1 to 4.

The polyamic acid ester preferably contains 80 to 100 mol.%, most preferably 90–100 mol.%, of component (a) and preferably 0 to 20 mol.%, most preferably 0 to 10 mol.%, of component (b). Component (a) and/or (b) may be replaced by up to 50 mol.%, preferably by up to 30 mol.% and, most preferably, by up to 15 mol.%, of the corresponding polyamic acid esters, based on component (a) and/or (b). (In this case, $R^1$ in formulae I to IV is a hydrogen atom).

Z in formula I preferably has the formulae

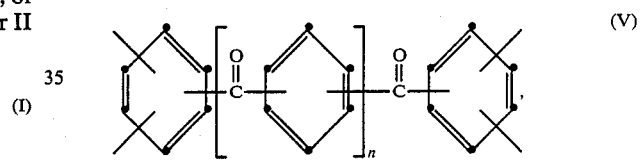

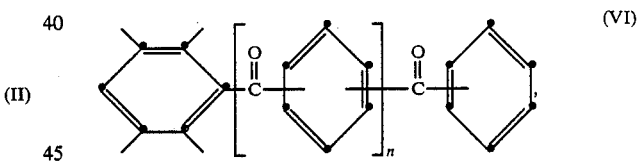

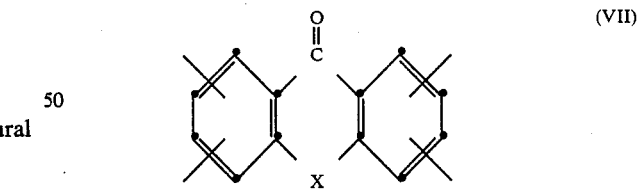

wherein n is 0 or 1 and X is a direct bond, —CH$_2$—, —O—, —S—, —SO—, —SO$_2$—, —NR$^x$—, CR$^x$R$^y$— or —CO—, and the free bonds are located in the ortho-position, R$^x$ is hydrogen or C$_1$–C$_6$alkyl, phenyl, benzyl or cyclohexyl, and R$^y$ has the significance of R$^x$ *but is not hydrogen*.

The radicals of formulae V, VI and VII may be substituted, e.g. by C$_1$–C$_4$alkyl or C$_1$–C$_4$alkoxy, or by halogen such as Cl.

X in formula VII is preferably —O— or —CO—, In a preferred embodiment, Z corresponds to the formulae

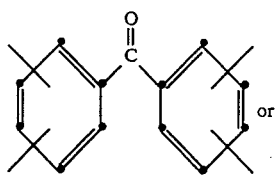

or

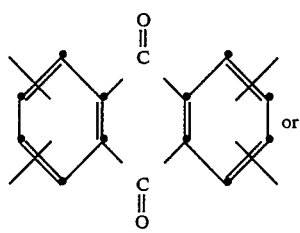

or

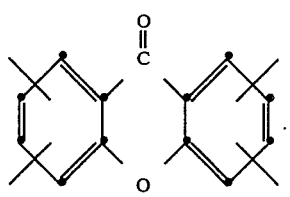

As substitutent in formula II, $R^2$ may be $C_1$-$C_4$alkyl and m is preferably 1, 2, 3 or 4. Preferably $R^2$ is a hydrogen atom or methyl.

Z' as tetravalent aromatic radical contains preferably 6 to 30, most preferably 6 to 20, carbon atoms. In a preferred subgroup, Z' corresponds to the formulae

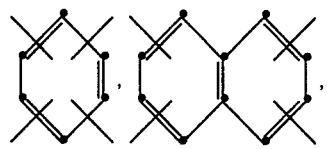

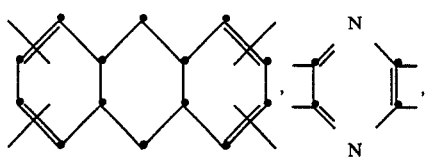

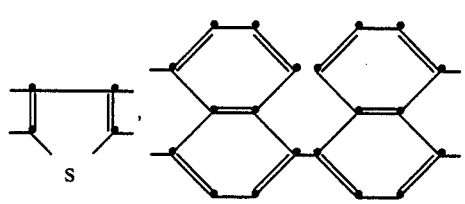

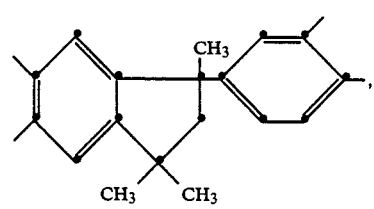

-continued

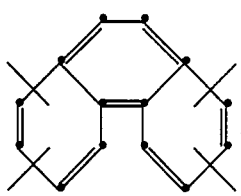

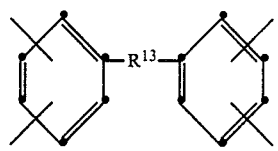

wherein $R^{13}$ is a direct bond or a bridge of the formula

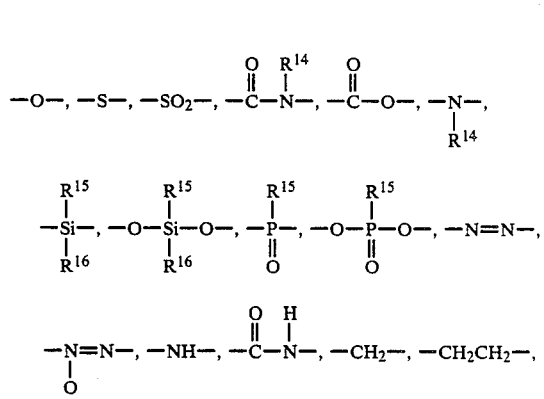

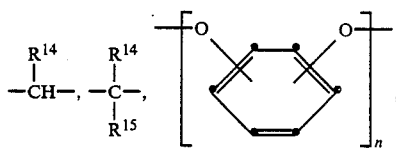

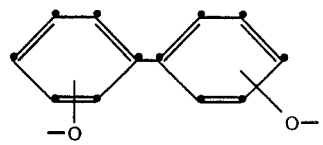

wherein $R^{14}$, $R^{15}$ and $R^{16}$ are $C_1$-$C_6$alkyl, phenyl or benzyl, and $R^{15}$ and $R^{16}$ may also be $C_1$-$C_6$alkoxy, phenyloxy or benzyloxy.

In the above formulae, each pair of free bonds is always located in peri- and/or ortho-position.

A preferred subgroup Z' comprises radicals of the formulae

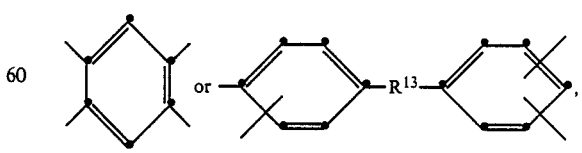

wherein $R^{13}$ is a direct bond, —O—, —SO$_2$— or —CH$_2$—. The free bonds are located in the ortho-position.

Most preferably, Z' is a radical of the formula

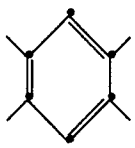

Examples of tetracarboxylic anhydrides containing a radical Z' are:
2,3,9,10-perylenetetracarboxylic dianhydride,
1,4,5,8-naphthalenetetracarboxylic dianhydride,
2,6-dichloronaphthalene-1,4,5,8-tetracarboxylic dianhydride,
2,7-dichloronaphthalene-1,4,5,8-tetracarboxylic dianhydride,
2,3,6,7-tetrachloronaphthalene-1,4,5,8-tetracarboxylic dianhydride,
phenanthrene-1,8,9,10-tetracarboxylic dianhydride,
pyromellitic dianhydride,
3,3',4,4'-biphenyltetracarboxylic dianhydride,
2,2',3,3'-biphenyltetracarboxylic dianhydride,
4,4'-isopropylidenediphthalic anhydride,
3,3'-isopropylidenediphthalic anhydride,
4,4'-oxydiphthalic anhydride,
4,4'-sulfonyldiphthalic anhydride,
3,3'-oxydiphthalic anhydride,
4,4'-methylenediphthalic anhydride,
4,4'-thiodiphthalic anhydride,
4,4'-ethylidenediphthalic anhydride,
2,3,6,7-naphthalenetetracarboxylic dianhydride,
1,2,4,5-naphthalenetetracarboxylic dianhydride,
1,2,5,6-naphthalenetetracarboxylic dianhydride,
benzene-1,2,3,4-tetracarboxylic dianhydride,
thiophene-2,3,4,5-tetracarboxylic dianhydride,
1-(3',4'-dicarboxyphenyl)-1,3,3-trimethylindane-5,6-dicarboxylic dianhydride
1-(3',4'-dicarboxyphenyl)-1,3,3-trimethylindane-6,7-dicarboxylic dianhydride,
1-(3',4'-dicarboxyphenyl)-3-methylindane-5,6-dicarboxylic dianhydride,
1-(3',4'-dicarboxyphenyl)-3-methylindane-6,7-dicarboxylic dianhydride.

Z'' in formula IV preferably corresponds to a radical of the formula

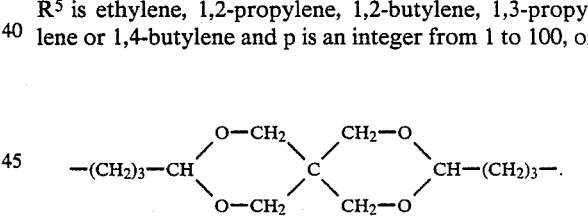

wherein $R^{18}$ is a bridge or a direct bond and the free bonds are located in ortho-position. A bridge $R^{18}$ is preferably —O—, —S—, —SO—, —SO$_2$—, —CH$_2$— or alkylidene of 2 to 6 carbon atoms, cyclopentylidene or cyclohexylidene.

$R^1$ as a saturated aliphatic radical is preferably unsubstituted or substituted linear or branched alkyl, or cycloalkyl or aralkyl (aryl-substituted alkyl). Alkyl may be interrupted by hetero atoms such as —O— or —S—, and contains preferably 1 to 18, in particular 1 to 12 and, most preferably, 1 to 6, carbon atoms. Cycloalkyl contains preferably 5 or 6 ring carbon atoms and may be substituted, e.g. by $C_1$-$C_4$alkyl. Aralkyl contains preferably 1 or 2 carbon atoms in the alkyl moiety and is preferably phenylethyl or benzyl. Aralkyl may be substituted, e.g. by $C_1$-$C_4$alkyl. Suitable substituents of $R^1$ as alkyl are e.g. hydroxyl, cyano, cyclopentyl and cyclohexyl.

Examples of radicals $R^1$ are: methyl, ethyl, n-propyl, isopropyl, n-butyl, isobutyl, pentyl, hexyl, 2-ethylhexyl, heptyl, octyl, nonyl, decyl, undecyl, dodecyl, tetradecyl, hexadecyl, octadecyl, β-methoxyethyl, β-hydroxyethyl, γ-hydroxypropyl, cyclohexylmethyl, cyclohexyl, cyclopentyl, methylcyclohexyl, benzyl, β-phenylethyl, and methylbenzyl.

In a preferred embodiment, $R^1$ is $C_1$-$C_4$alkyl or benzyl.

A divalent organic radical R is preferably an unsubstituted or substituted divalent aliphatic, cycloaliphatic, araliphatic or aromatic radical.

A divalent aliphatic radical R in formulae I to IV preferably contains 2 to 30, in particular 6 to 30 and, most preferably, 6 to 20 carbon atoms. In a preferred sub-group, R is linear or branched alkylene which may be interrupted by oxygen atoms, NR$^a$, ⊕NR$_2^a$G⊖, cyclopentylene, cyclohexylene, naphthylene, phenylene or hydantoin radicals. R$^a$ may be for example alkyl of 1 to 12 carbon atoms, cycloalkyl of 5 or 6 ring atoms, phenyl or benzyl, G⊖ is an anion of a protic acid, for example halide, sulfate or phosphate. In a further preferred embodiment, R is linear or branched alkylene, —(CH$_2$)$_x$—R$^3$—(CH$_2$)$_y$—, wherein R$^3$ is phenylene, naphthylene, cyclopentylene or cyclohexylene and x and y are each independently of the other 1, 2 or 3, —R$^4$—(OR$^5$)$_p$O—R$^4$—, in which R$^4$ is ethylene, 1,2-propylene, 1,3-propylene or 2-methyl-1,3-propylene, R$^5$ is ethylene, 1,2-propylene, 1,2-butylene, 1,3-propylene or 1,4-butylene and p is an integer from 1 to 100, or

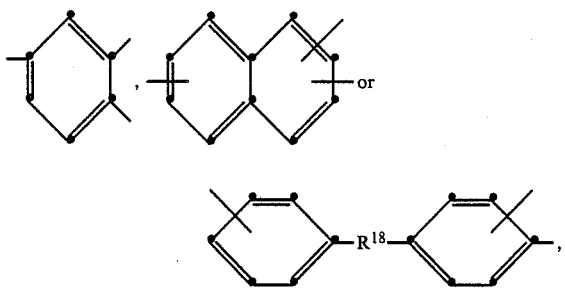

Examples of aliphatic radicals are: ethylene, 1,2- or 1,3-propylene, 2,2-dimethyl-1,3-propylene, 1,2-, 1,3- or 1,4-butylene, 1,3- or 1,5-pentylene, the hexylenes, heptylenes, octylenes, decylenes, dodecylenes, tetradecylenes, hexadecylenes, octadecylenes, eicosylenes, 2,4,4-trimethylhexylene, 1,10-dialkyldecylene, in which the alkyl preferably contains 1 to 6 carbon atoms, substituted 1,11-undecylenes, for example those described in European patent application No. B-0 011 559, jeffamines, for example

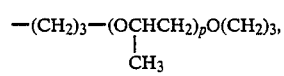

in which p is 1 to 100, or

in which p is 1-100, dimethylenecyclohexane, xylylene and diethylenebenzene, R is most preferably branched alkylene containing 8 to 30 carbon atoms in the chlaim.

Aliphatic radicals interrupted by heterocyclic radicals may be e.g. those derived from N,N'-aminoalkylated hydantoins or benzimidazoles. Examples are N,N'-(γ-aminopropyl)-5,5-dimethylhydantoin or N,N'-(γ-aminopropyl)-benzimidazolones, and those of the formula

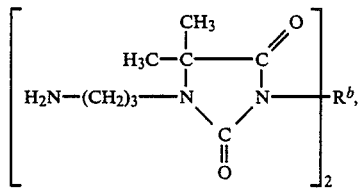

in which $R^b$ is alkylene of 1 to 12, preferably 1 to 4, carbon atoms or

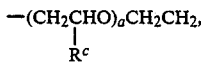

in which $R^c$ is a hydrogen atom or methyl and a is an integer from 1 to 20.

Examples of suitable substitutents of the aliphatic radicals are halogens such as F or Cl, and alkoxy of 1 to 6 carbon atoms.

A divalent cycloaliphatic radical R in formulae I to IV preferably contains 5 to 8 ring carbon atoms and is, in particular, mononuclear or binuclear cycloalkylene which has 5 to 7 ring carbon atoms and is unsubstituted or substituted by alkyl which preferably contains 1 to 4 carbon atoms. In a preferred embodiment, a cycloaliphatic radical is one of the formula

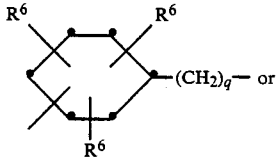

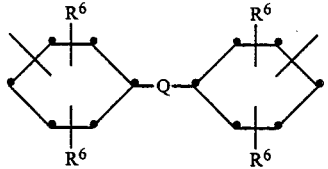

wherein q is 0 or 1, each $R^6$ is independently hydrogen or alkyl of 1 to 6 carbon atoms and Q is a direct bond, O, S, $SO_2$, alkylene of 1 to 3 carbon atoms or alkylidene of 2 to 6 carbon atoms, $R^6$ is preferably ethyl or methyl, Q is preferably methylene and the alkylidene radical preferably contains 2 or 3 carbon atoms and is, for example, ethylidene or 1,1- or 2,2-propylidene.

Examples of a cycloalkylene radical R are typically: 1,2- or 1,3-cyclopentylene, 1,2-, 1,3- or 1,4-cyclohexylene, cycloheptylene, cyclooctylene, methylcyclopentylene, methyl- or dimethylcyclohexylene, 3- or 4-methylcyclohex-1-yl, 5-methyl-3-methylenecyclohex-1-yl, 3,3'- or 4,4'-biscyclohexylene, 3,3'-dimethyl-4,4'-biscyclohexylene, 4,4'-biscyclohexylene ether, 4,4'-biscyclohexylenesulfone, 4,4'-biscyclohexylene-methane or 4,4'-biscyclohexylene-2,2-propane, as well as the divalent radicals of bisaminomethyltricyclodecane, bisaminomethylnorborane and menthanediamine, A particularly preferred divalent cycloaliphatic radical R is 1,4-or 1,3-cyclohexylene, methylenebis(cyclohex-4-yl) or methylenebis(3-methylcyclohex-4-yl).

An araliphatic radical R preferably contains 7 to 30 carbon atoms. If, as is preferred, the aromatic group of the araliphatic radical is attached to the N-atoms in the radical of the formula I or II, these aromatic groups are preferably substituted in the same manner as an aromatic radical R, including the preferred substitutions. The araliphatic radical preferably contains 7 to 26, most preferably 8 to 22, carbon atoms. The aromatic radical in the araliphatic radical is preferably a phenyl radical. An araliphatic radical R is, in particular, aralkylene which is unsubstituted or substituted by alkyl in the aryl moiety, the alkylene radical being linear or branched. In a preferred embodiment, the araliphatic radical has the formula

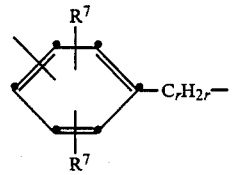

wherein each of the radicals $R^7$ independently is a hydrogen atom or preferably $C_1$-$C_6$ alkyl, and r is an integer from 1 to 20. The free bond can be ortho, meta or preferably para to the $C_rH_{2r}$ group and one $R^7$ or each $R^7$ is preferably located para to the free bond.

Examples of a divalent araliphatic radical R are typically: m- or p-benzylene, 3-methyl-p-benzylene, 3-ethyl-p-benzylene, 3,5-dimethyl-p-benzylene, 3,5-diethyl-p-benzylene, 3-methyl-5-ethyl-p-benzylene, p-phenylenepropylene, 3-methyl-p-phenylene-propylene, p-phenylenebutylene, 3-ethyl-p-phenylenepentylene and, in particular, longer-chain phenylenealkylene radicals of diamines, which are described e.g. in European patent application No. A-0 069 062: 6-(p-phenylene)-6-methylhept-2-yl, 6-(3'-methyl-p-phenylene)-6-methylhept-2-yl, 6-(3'-ethyl-p-phenylene)-6-methylhept-2-yl, 6-(3',5'-dimethyl-p-phenylene)-6-methylhept-2-yl, 11-(p-phenylene)-2,11-dimethyl-dodec-1-yl and 13-(p-phenylene)-2,12-dimethyltetradec-3-yl.

Particularly preferred homopolyamic and copolyamic acid esters are those containing structural units of formulae I to IV in which R denotes unsubstituted and, in particular, substituted, aromatic radicals. The substituent on the aromatic radical preferably contains 1 to 20, in particular 1 to 12 and most preferably 1 to 6, carbon atoms. The substituent is in particular linear or branched alkyl, alkoxy or alkoxyalkyl, each of 1 to 6 carbon atoms, benzyl, trimethylene or tetramethylene. Alkoxymethyl is the preferred alkoxyalkyl radical and methoxy is the preferred alkoxy radical. Examples of the substituent are: methyl, ethyl, propyl, isopropyl, n-butyl, isobutyl, pentyl, hexyl, octyl, dodecyl, tetradecyl, eicosyl, methoxy, ethoxy, propoxy, butoxy, pentoxy, hexoxy, methoxymethyl, methoxyethyl, ethoxymethyl, propoxymethyl, butoxymethyl, benzyl, methylbenzyl, and phenethyl. Preferred radicals are methoxymethyl, ethoxymethyl, methyl, ethyl, n-propyl, i-propyl, trimethylene and tetramethylene. Methyl and ethyl are particularly preferred. The substituted aromatic radical can be a mononuclear or polynuclear radical, in particular a binuclear radical. Mononuclear radicals may contain 1 to 4, preferably 2 to 4 and most preferably 4, substituents, and binuclear radicals may contain 1 to 4, preferably 2, substituents in each nucleus. It has been found that the photosensitivity of homopolymers or copolymers is particularly high if one or preferably two substituents are located ortho to the —NH—group. Further, such polyamides have particularly good thermomechanical properties. Substitution in one or both of the ortho-positions is thus preferred. The aromatic radical is preferably located meta or para to the —NH— group.

An aromatic radical R may contain 6 to 30, in particular 6 to 20, carbon atoms. The aromatic radical is preferably a hydrocarbon radical, in particular a mononuclear or binuclear phenylene radical, a naphthylene radical or a pyridine radical, which is substituted by alkyl, alkoxyalkyl, alkoxy, trimethylene or tetramethylene.

A preferred sub-group comprises those aromatic radicals of the formulae

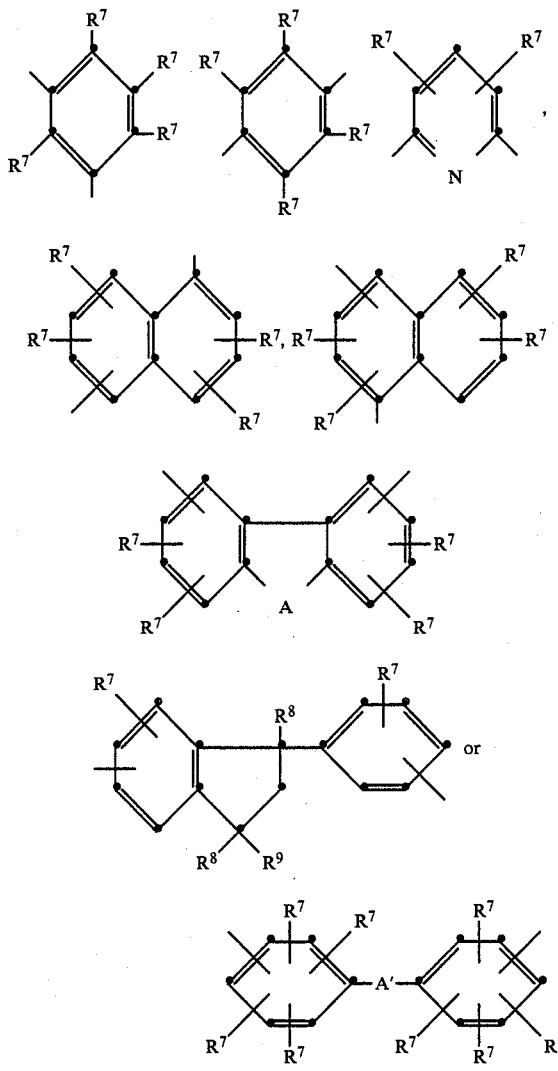

wheren each $R^7$ is a hydrogen atom and, in the case of monosubstitution, one substituent $R^7$ is alkyl of 1 to 6 carbon atoms and the other substituents $R^7$ are hydrogen, and in the case of di-, tri- or tetra-substitution, two substituents $R^7$ are alkyl of 1 to 6 carbon atoms and the other substituents $R^7$ are hydrogen atoms or alkyl of 1 to 6 carbon atoms, or in the case of di-, tri- or tetra-substitution, two vicinal substituents $R^7$ in the phenyl ring are trimethylene or tetramethylene and the other substituents $R^7$ in the phenyl ring are trimethylene or tetramethylene and the other substituents $R^7$ are hydrogen atoms or alkyl of 1 to 6 carbon atoms, A is O, S, NH, CO or $CH_2$, $R^8$ is a hydrogen atom or alkyl of 1 to 5 carbon atoms, $R^9$ is alkyl of 1 to 5 carbon atoms and A' is a direct bond, O, S, SO, $SO_2$, CO,

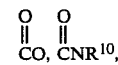

$NR^{10}$, CONH, NH, $R^{10}SiR^{11}$, $R^{10}OSiOR^{11}$, alkylene of 1 to 6 carbon atoms or alkylidene of 2 to 6 carbon atoms, phenylene or phenyldioxy, in which $R^{10}$ and $R^{11}$ are each independently of the other alkyl of 1 to 6 carbon atoms or phenyl. $R^8$ and $R^9$ are preferably methyl, A is preferably —$CH_2$— or —O— and A' is preferably a direct bond, —O—, —$CH_2$— or alkylidene of 2 to 4 carbon atoms. $R^{10}$ and $R^{11}$ are preferably methyl, ethyl or phenyl. Alkylene preferably contains 2 to 4 carbon atoms and is in particular ethylene.

A preferred subgroup comprises toluylene radicals, radicals of o,o'-substituted diaminodiphenylenes, diaminodiphenylmethanes and diaminodiphenyl ethers.

A particularly preferred group comprises those aromatic radicals of the formulae

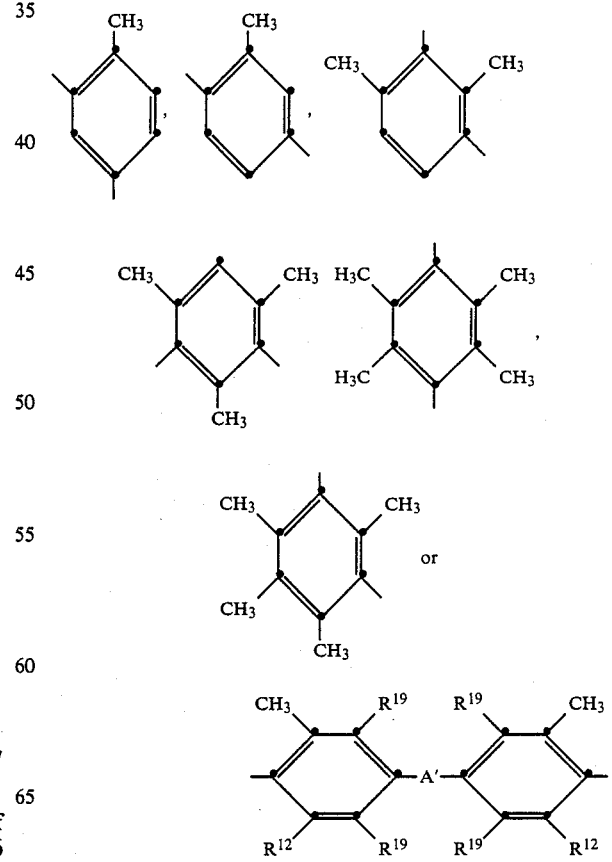

wherein A' is a direct bond, —O— and preferably —CH₂—, and R¹² is a hydrogen atom and is preferably methyl or ethyl, and R¹⁹ is a hydrogen atom or preferably methyl or ethyl.

Examples of unsubstituted and substituted aromatic radicals are: 1,3- or 1,4-phenylene, 2,4- or 2,7-naphthylene, 4,4'-diphenylene, 4,4'-diphenylenemethane, 4,4'-diphenylene ether, 4-methyl-1,3-phenylene, 4-ethyl-1,3-phenylene, 2-methyl-1,3-phenylene, 4-benzyl-1,3-phenylene, 4-methoxymethyl-1,3-phenylene, tetrahydro-1,3- or -1,4-naphthylene, 3-propyl-1,3- or -1,4-phenylene, 3-isopropyl-1,4-phenylene, 3,5-dimethyl-1,4-phenylene, 2,4-dimethyl-1,3-phenylene, 2,3-dimethyl-1,4-phenylene, 5-methyl-1,3-phenylene, 2,3,5,6-tetramethyl-1,4- or -1,3-phenylene, 3-methyl-2,6-pyridylene, 3,5-dimethyl-2,6-pyridylene, 3-ethyl-2,6-pyridylene, 1-methyl-2,7-naphthylene, 1,6-dimethyl-2,7-naphthylene, 1-methyl-2,4-naphthylene, 1,3-dimethyl-2,4-naphthylene, the divalent radicals of 5-amino-1-(3'-amino-4'-methylphenyl)-1,3,3-trimethylindane or 6-amino-5-methyl-1-(3'-amino-4'-methyl)-1,3,3-trimethylindane, 4-methoxymethyl-1,3-phenylene, 3-methyl-p-diphenylene, 3-ethyl-p-diphenylene, 3,3'-dimethyl-p-diphenylene, 3,3'-diethyl-p-diphenylene, 3-methyl-3'-ethyl-p-diphenylene, 3,3',5,5'-tetramethyl-diphenylene, 3,3'-methyl-5,5'-ethyl-p-diphenylene, 4,4'-dimethyl-m-diphenylene, 3,3'-diisopropyldiphenylene and radicals of the formulae

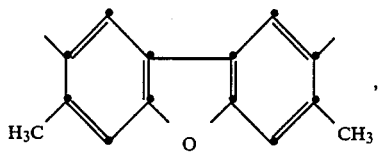

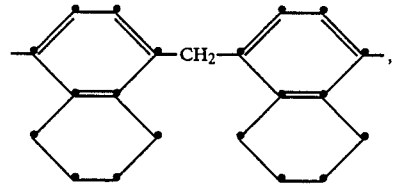

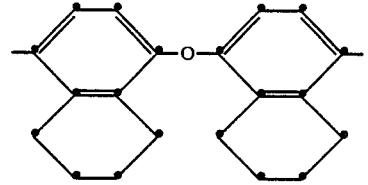

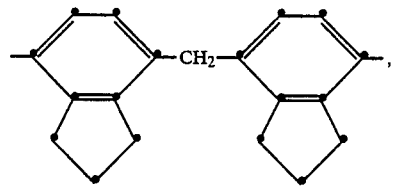

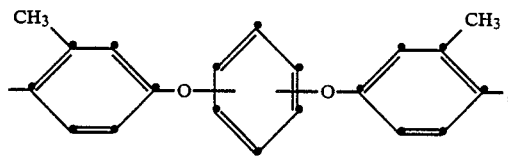

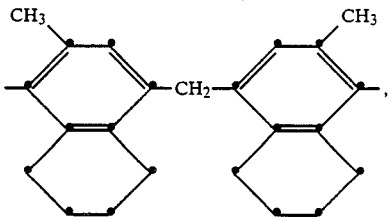

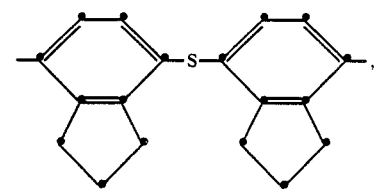

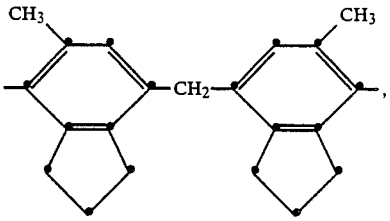

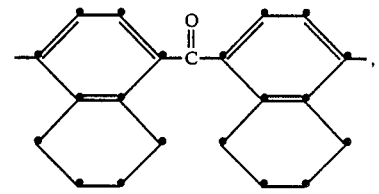

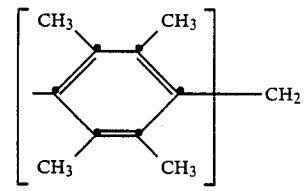

as well as

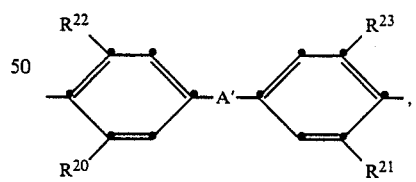

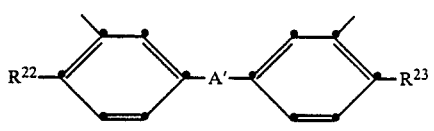

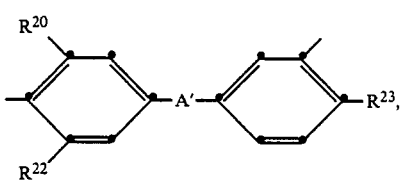

-continued

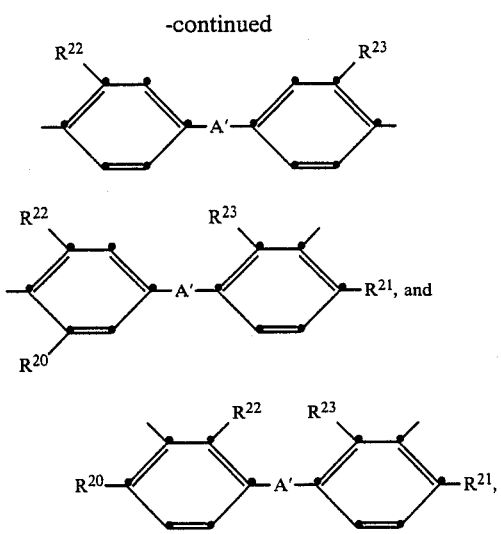

wherein A', $R^{22}$, $R^{23}$, $R^{20}$ and $R^{21}$ have the meanings indicated in the following Table. The three tetrasubstituted radicals of the above formulae may be substituted in each nucleus by radicals G and/or H, where G and H have the meanings given for $R^{22}$.

| A' | $R^{22}$ | $R^{23}$ | $R^{20}$ | $R^{21}$ |
|---|---|---|---|---|
| $CH_2$ | methyl | methyl | — | — |
| $CH_2$ | methyl | ethyl | — | — |
| $CH_2$ | ethyl | ethyl | — | — |
| $CH_2$ | isopropyl | isopropyl | — | — |
| $CH_2$ | methoxymethyl | | — | — |
| $CH_2$ | benzyl | benzyl | — | — |
| $CH_2$ | methyl | methyl | H | H |
| $CH_2$ | ethyl | ethyl | H | H |
| $CH_2$ | isopropyl | isopropyl | H | H |
| $CH_2$ | methoxymethyl | | H | H |
| $CH_2$ | methyl | ethyl | H | H |
| $CH_2$ | methoxymethyl | | methoxymethyl | |
| $CH_2$ | methyl | methyl | methyl | methyl |
| $CH_2$ | ethyl | ethyl | ethyl | ethyl |
| $CH_2$ | methyl | methyl | ethyl | ethyl |
| $CH_2$ | ethyl | ethyl | isopropyl | isopropyl |
| $CH_2$ | isopropyl | isopropyl | isopropyl | isopropyl |
| $CH_2$ | isopropyl | isopropyl | H | H |
| $CH_2$ | methoxy | methoxy | H | H |
| O | methyl | methyl | — | — |
| O | ethyl | ethyl | — | — |
| O | methyl | methyl | H | H |
| O | methyl | methyl | methyl | methyl |
| O | methyl | methyl | ethyl | ethyl |
| S | methyl | methyl | — | — |
| S | ethyl | ethyl | — | — |
| S | methyl | methyl | H | H |
| S | methyl | methyl | methyl | methyl |
| S | ethyl | ethyl | ethyl | ethyl |
| S | methyl | methyl | ethyl | ethyl |
| CO | methyl | methyl | — | — |
| CO | methyl | methyl | H | H |
| CO | methyl | methyl | methyl | methyl |
| $SO_2$ | methyl | methyl | — | — |
| $SO_2$ | methyl | methyl | H | H |
| $SO_2$ | methyl | methyl | methyl | methyl |
| $SO_2$ | ethyl | ethyl | methyl | methyl |
| SO | methyl | methyl | — | — |
| SO | methyl | methyl | H | H |
| COO | methyl | methyl | H | H |
| COO | methyl | methyl | methyl | methyl |
| $CONCH_3$ | methyl | methyl | H | H |
| $NCH_3$ | methyl | methyl | — | — |
| $NCH_3$ | methyl | methyl | methyl | methyl |
| CONH | methyl | methyl | — | — |
| NH | ethyl | ethyl | H | H |
| NH | methyl | methyl | — | — |
| $Si(methyl)_2$ | methyl | methyl | — | — |

-continued

| A' | $R^{22}$ | $R^{23}$ | $R^{20}$ | $R^{21}$ |
|---|---|---|---|---|
| $Si(phenyl)_2$ | methyl | methyl | methyl | methyl |
| $Si(Omethyl)_2$ | ethyl | ethyl | — | — |
| $Si(Ophenyl)_2$ | methyl | methyl | H | H |
| ethylene | methyl | methyl | — | — |
| ethylene | methyl | methyl | methyl | methyl |
| ethylene | ethyl | ethyl | H | H |
| ethylene | methyl | methyl | — | — |
| phenylene | H | H | methyl | methyl |
| phenylene | ethyl | ethyl | — | — |
| $(CH_3)_2C<$ | methyl | methyl | H | H |
| $(CH_3)_2C<$ | methyl | methyl | methyl | methyl |

The polyamic acid esters eligible for use in the practice of this invention can have average molecular weights ($\overline{M}w$) of not less than 2000, preferably of not less than 5000. The upper limit depends essentially on the desired properties such as ease of processing or solubility, and can be up to 500,000, preferably up to 100,000 and, most preferably, up to 50,000. The copolymers can furthermore be random polymers or block polymers. They are prepared by conventional methods in apparatus envisaged for the purpose.

The starting materials for the preparation of the polyamic acid esters are known, commercially available, or can be obtained by known methods. Tetracarboxylic acids containing structural units of formulae V and VI are described in GB patent specification No. 1 222 630, and in French patent specifications Nos. 1 601 094 and 1 565 700.

The aminodicarboxylic acids containing substituted structural units of formula II are novel. They may be obtained e.g. as follows:

Trimellitic n-butylimide is converted with $SO_2Cl_2$ into

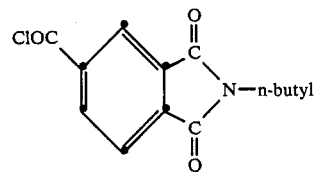

which is reacted, in the presence of $AlC_2$, with

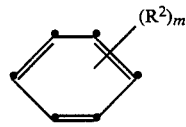

to give

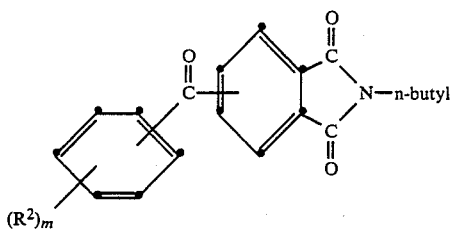

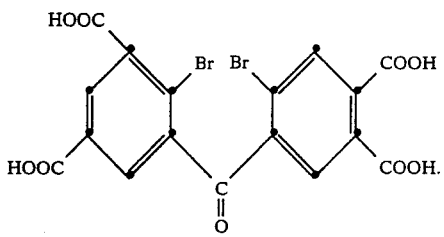

This compound is nitrated with NHO₃ and the nitro compound is catalytically hydrogenated to give the amino compound

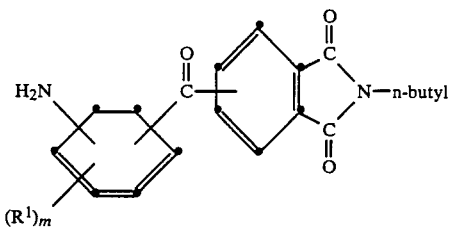

The imide can be converted in known manner into its acid derivatives.

4,4'-Ketobis(naphthalenedicarboxcylic acid) can be obtained by reaction of 2 moles of dimethylnaphthalene with COCl₂, in the presence of AlCl₃, and subsequent oxidation of the resultant 4,4'-ketobis(dimethylnaphthalene) with HNO₃ to give the tetracarboxylic acid. This tetracarboxylic acid can be partically hydrogenated to the 4,4'-keto(tetrahydronaphthalenedicarboxylic acid). The hydrogenation can also be carried out before the oxidation with 4,4'-ketobis(dimethylnaphthalene).

Some tetracarboxylic acids containing structural units Z, especially those of formula VII, are known.

Anthraquinonetetracarboxylic acids are described e.g. in U.S. Pat. No. 3,702,318 and CA 100,1006119a (1984).

Hydrogenation of the keto groups in anthraquinonetetracarboxylic acids with e.g. NaBH₄ gives the corresponding dihydroxy compound, which can be converted into anthronetetracarboxylic acid by treatment with hydrochloric acid under reflux. The CH₂ group of the anthronetetracarboxylic acid can be alkylated in known manner and thus converted into the CHR$^x$ or CR$^x$R$^y$ group.

Fluorononetetracarboxylic acid can be prepared e.g. by dimerising 3,4-dimethylmagnesium bromide in the presence of CuCl₂ and reacting the resultant 3,3',4,4'-tetramethylbiphenyl with COCl₂, in the presence of AlCl₃, to the tetramethylfluorenone, which can be oxidised in known manner with e.g. NHO₃ to the tetracarboxylic acid.

Xanthonetetracarboxylic acid is obtained by first reacting 3,3',4,4'-tetramethylphenyl ether with CCl₄, in the presence of AlCl₃, and subsequently hydrolysing the reaciton product with dilute HCl to 2,3,6,7-tetramethylxanthone, which is oxidised in known manner with e.g. HNO₃ to the tetracarboxylic acid.

Tetracarboxylic acids containing structural units of formula VII, wherein X is S, SO₂ or NR$^x$, can be obtained in the following manner: 1-bromo-3,4-dimethylbenzene is reacted with CCl₄, in the presence of AlCl₃, to bis(2-bromo-3,4-dimethylphenyl)dichloromethane. Oxidation with 20% NHO₃ gives Reaction with Na₂S gives the thioxanthonetetracarboxylic acid, which can be oxidised in known manner to the sulfoxide or sulfone. Reaction with NaNH₂ or R$^x$NH₂ gives the acridonetetracarboxylic acid.

Aminodicarboxylic acids containing structural units of formula IV, and diamines H₂NRNH₂ as well as tetracarboxylic acids containing structural units Z', are known, commercially available, or can be obtained by known methods. Silicone-containing diamines containing the

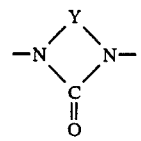

group can be prepared from the diisocyanates disclosed in German Offenlegungsschrift No. 2 318 170. Alkyl- or cycloalkyl-substituted diamines, in particular ethyl- or propyl-substituted diamines, can be obtained by alkylation of unsubstituted or partially substituted aromatic diamines with alkenes or cycloalkenes respectively (q.v. U.S. Pat. No. 3,275,690). Mononuclear, in particular binuclear, aromatic diamines can be obtained by condensing appropriate monoamines with aldehydes or ketones.

Polyamic acids are obtained in known manner from appropriate tetracarboxylic acids or anhydrides thereof and diamines, preferably in solution, in the temperature range from e.g. −30° to +100° C. The free carboxyl groups can be esterified by different methods:

(a) with dialkyl sulfates in the presence of alkali metal carbonates, e.g. K₂CO₃, (b) with alkyl or aralkyl halides in the presence of 1,8-diazabicyclo-[5.4.0]undec-7-ene, (c) with alkylene oxides, and (d) by transesterification of polyamic acid esters.

The polyamic acid esters can also be obtained direct by reacting tetracarboxylic acid diester halides with diamines, which can in turn be prepared by esterification of dianhydrides and subsequent chlorination of the carboxyl groups.

The polyamic acid esters are polymers which can be crosslinked direct by applying irradiation. They are suitable for making sheets, filaments and for coating substrates, for protective insulation or for producing relief images, for which utilities the properties of the polycondensates can be modified by irradiation.

A preferred field of application is the use of the material of this invention for providing protective coatings and relief images on such coated substrates. Such utility constitutes a further object of the invention. It is especially advantageous that, for the attainment of desired properties, the polycondensates of this invention can be adapted for specific requirements regarding their use by the choice of different monomers and/or by mixing them with different polyamic acid esters. In addition, the polyamic acid esters are readily soluble, which is advantageous for processing.

To produce the coated material of this invention, the polyamic acid ester or a mixture thereof is advantageously dissolved in a suitable organic solvent, with or without the application of heat. Examples of suitable solvents are polar, aprotic solvents which can be used by themselves or in mixtures of at least two solvents. Examples are: ethers such as dibutyl ether, tetrahydrofuran, dioxane, methylene glycol, dimethylethylene glycol, dimethyldiethylene glycol, diethyldiethylene glycol and dimethyltriethylene glycol; halogenated hydrocarbons such as methylene chloride, chloroform, 1,2-dichloroethane, 1,1,1-trichloroethane and 1,1,2,2-tetrachloroethane; carboxylic acid esters and lactones such as ethyl acetate, methyl propionate, ethyl benzoate, 2-methoxyethyl acetate, $\gamma$-butyrolactone, o-valerolactone and pivalolactone; carboxamides and lactams such as formamide, acetamide, N-methylformamide, N,N-dimethylformamide, N,N-diethylformamide, N,N-dimethylacetamide, N,N-diethylacetamide, $\gamma$-butyrolactam, $\epsilon$-caprolactam, N-methylpyrrolidone, N-acetylpyrrolidone, N-methylcaprolactam, tetramethylurea and hexamethylphosphoric triamide; sulfoxides such as dimethylsulfoxide; sulfones such as dimethyl sulfone, diethyl sulfone, trimethylene sulfone and tetramethylene sulfone; trimethylamine, triethylamine, N-methylpyrrolidine, N-methylpiperidine, N-methylmorpholine and substituted benzenes such as chlorobenzene, nitrobenzene, phenols or cresol.

Undissolved constituents can be removed by filtration, preferably by pressure filtration. The concentration of polymer in the coating agent thus obtained is preferably not more than 50% by weight, in particular not more than 30% by weight and most preferably not more than 20% by weight, based on the solution. The solutions are storage stable.

Other customary modifiers which do not adversely affect the photosensitivity can be incorporated during the preparation of the solutions. Examples of such modifiers are delustering agents, flow control agents, finely particulate fillers, flameproofing agents, fluorescent whitening agents antioxidants, light stabilisers, stabilisers, dyes, pigments and adhesion promoters. If desired, sensitisers may also be incorporated in order to increase the photosensitivity still further.

The coating agent can be applied to suitable substrates by conventional methods such as immersion, brushing and spraying methods and whirl coating, cascade coating and curtain coating. Examples of suitable substrates are plastics, metals and metal alloys, semimetals, semiconductors, glass, ceramics and other inorganic materials, for example $SiO_2$ and $Si_3N_4$. After coating, the solvent is removed, if necessary by warming and if necessary in vacuo. Non-tacky, dry, uniform films are obtained. The film can have, coating thicknesses of up to about 500 $\mu m$ or more, preferably of 0.5 to 500 $\mu m$ and in particular of 1 to 50 $\mu m$, depending on their use.

The radiation-sensitive coating of the material of this invention can be crosslinked by applying irradiation.

The photostructuring or photocrosslinking can be effected by high-energy radiation, for example by light, in particular in the UV range, by X-rays, laser light, electron beams and the like. The material of this invention is admirably suitable for producing protective films and passivating lacquers and as a photographic recording material for heat-stable relief images.

This utility also constitutes an object of the invention. Examples of fields of use are protective, insulating and passivating lacquers in electrotechnology and electronics, photomasks for electronics, textile printing and the graphics industry, etch resists for the production of printed circuits and printing plates and integrated circuits, relays for the production of X-ray masks, solder-stopping lacquers, dielectrics for multilayer circuits and structural elements for liquid crystal displays.

Protective films are produced by direct exposure, the exposure times essentially depending on the coating thicknesses and the photosensitivity, followed by an optional thermal aftertreatment.

Photographic production of the relief structure is effected by image-wise exposure through a photomask, and subsequent development with a solvent or a solvent mixture while removing the unexposed areas, after which the image produced may be stabilised by an optional thermal after-treatment.

The thermal aftertreatment is conveniently carried out in the temperature range from 150° to 450° C., preferably from 200° to 400° C., when the polyamic acid ester is converted into the corresponding polyimide. The advantageous properties of the polyimides are thereby obtained.

Such a process for producing protective layers and relief structures constitutes yet a further object of the invention. Suitable developers are e.g. the solvents indicated above.

The polymer layer of the material of this invention has a photosensitivity which is sufficient for many end uses and in some cases is high, and it can be photocrosslinked directly. The protective films and relief images especially those of polyimide coatings, are distinguished by good adhesion and by heat resistance, mechanical strength and resistance to chemicals. The material is storage stable but should be protected from the action of light.

The following Examples illustrate the invention in more detail.

A.

PREPARATORY EXAMPLES

EXAMPLE 1

In a cylindrical vessel equipped with stirrer, dropping funnel, thermometer, and an inlet tube and outlet tube for nitrogen, 2.974 g (0.015 mole) of 4,4'-diaminodiphenylmethane are dissolved in 31 ml of dimethylformamide and the solution is cooled to 5° C. To this solution are added 4.832 g (0.015 mole) of benzophenonetetracarboxylic dianhydride and the mixture is stirred for 3 hours while raising the temperature to room temperature by removing the cooling bath.

To the highly viscous solution are then added 4.55 g (0.033 mole) of dry, powdered $K_2CO_3$ and 30 ml of dimethylformamide. A few minutes later, 5.1 g (0.033 mole) of diethyl sulfate are added. The reaction mixture is heated to 50° C. in a water bath and stirred for 1 hour to bring the esterification substantially to completion.

With efficient stirring, the solution is poured into 1 liter of dilute hydrochloric acid to precipitate the polymer, which is isolated by filtration and washed copiously with water. After drying at 60° C. in vacuo, a sample of the polymer is analysed by titration in perchloric acid in anhydrous medium to determine the number of carboxyl groups still remaining in the ethyl ester of the polyamic acid. The degree of esterification is 90%.

| Elemental analysis: (for 100% of esterified sample) | theory (% by weight) | found (% by weight) |
|---|---|---|
| C | 70.82 | 70.7 |
| H | 4.90 | 4.1 |
| N | 4.86 | 5.3 |
| O | 19.42 | 19.7 |

When a sample is heated in a differential scanning calorimeter (DSC), an endothermic reaction in the range from 250° to 400° C. is recorded in the first run, resulting from the evaporation of the alcohol split off during the conversion to the imide.

In a second run, a glass transition temperature of 265° C. is observed. This temperature accords with the glass transition temperature of the polyimide prepared separately from 4,4'-diaminodiphenylmethane and benzophenonetetracarboxylic dianhydride.

The reduced viscosity of the polyamic acid ester in solution (measured as 0.5% solution in m-cresol) is: $\eta_{red.}=0.83$ dl/g.

EXAMPLES 2–6

Following the procedure described in Example 1, the following diamines are reacted with benzophenonetetracarboxylic dianhydride and the resultant polyamic acid is esterified with $K_2CO_3$ and diethyl sulfate.

| Example | Diamine | $\eta_{red.}$ | Degree of esterification (%) |
|---|---|---|---|
| 2 | 3,3'-dimethyl-5,5'-di-ethyl-4,4'-diaminodiphenylmethane | 0.76 | 93 |
| 3 | 1,10-diaminodecane | 0.55 | 90 |
| 4 | 3,3'-dimethyl-4,4'-di-aminodiphenylmethane | 1.14 | 95 |
| 5 | 1-methyl-2,4-diamino-3,5-diethylbenzene | 0.36 | 96 |
| 6 | 3,3'-dimethyl-4,4'-di-aminodicyclohexylmethane | 0.72 | 96 |

EXAMPLE 7

Following the procedure of Example 1, the diamine employed in Example 2 is reacted with anthraquinonetetracarboxylic dianhydride (instead of benzophenonetetracarboxylic dianhydride) to give the polyamic acid, which is subsequently esterified with $K_2CO_3$ and diethyl sulfate.

$\eta_{red.}=0.21$ dl/g (0.5% solution in m-cresol).
degree of esterification: 93%.

EXAMPLE 8

Example 2 is repeated, using a corresponding amount of dimethyl sulfate instead of diethyl sulfate to esterify the polyamic acid and carrying out the esterification at 0° C.

$\eta_{red.}=0.98$ dl/g (0.5% in m-cresol)
degree of esterification: 98%.

EXAMPLE 9

Following the procedure of Example 1, 0.01 mole of 3,3',5,5'-tetraethyl-4,4'-diaminodiphenylmethane is reacted with 0.01 mole of benzophenonetetracarboxylic dianhydride in 25 ml of dimethylformamide to give the polyamic acid. After dilution with a further 25 ml of dimethylformamide, 0.02 mole of 1,8-diazabicyclo[5.4.0]undec-7-ene and 0.021 mole of benzyl chloride are added. After a few minutes, the reaction mixture is heated to 55° C. and kept for 1 hour at this temperature. The polymer is isolated as described in Example 1.

$\eta_{red.}=0.1$ dl/g (0.5% in m-cresol).
degree of esterification: 53%.

(B)

USE EXAMPLES

A thin polymer film is produced on a copper-clad plastic plate by whirl-coating a 5% polymer solution thereon and subsequently removing the solvent in a circulating air oven. The solvent employed is N-methylpyrrolidone or dimethylformamide.

The coated plates are exposed through a photomask at room temperature with a 1000 watt UV lamp from a distance of 18 cm. The exposed plates are then developed with a solvent and the unexposed areas of the polymer film are dissolved out. The relief image is then made visible by etching away the exposed copper layer with $FeCl_3$ solution.

The exposure times for obtaining a complete image on the polymer films described in Examples 1–9 are:

| Example | 1 | 2 | 3 | 4 | 5 | 6 | 7 | 8 | 9 |
|---|---|---|---|---|---|---|---|---|---|
| seconds | 120 | 30 | 120 | 60 | 60 | 60 | 60 | 60 | 120 |

The polyamic acid esters are converted in a manner known per se into the coresponding polyimides by heating them to about 400° C.

What is claimed is:

1. A coated material on a substrate, at least one surface of which substrate is coated with a layer of at least one polyamic acid ester, said polyamic acid ester comprising
   (a) 50 to 100 mol.%, based on the polyamic acid ester, of at least one recurring structural unit of formula I or II or a mixture thereof,

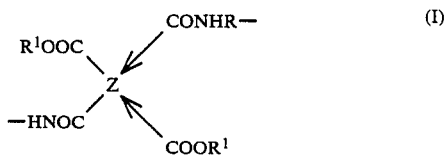

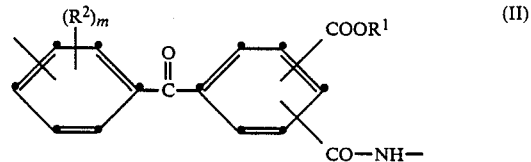

and
   (b) 0 to 50 mol.% of at least one recurring structural unit of formula III or IV or a mixture thereof

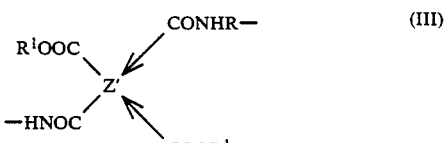

-continued

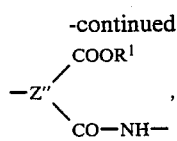
(IV)

wherein the arrows denote position isomerism, Z is a tetravalent phenyl-aromatic radical which contains a benzophenone structural unit and in which one of the ester groups and one of the amide groups in formula I are attached in the ortho-position either to one phenyl radical or to two different phenyl radicals, and the ester and amide groups in formula II are located in the ortho-position, Z' is a tetravalent aromatic radical which differs from Z and Z" is a trivalent aromatic radical which differs from the radical of formula II, wherein one ester group and one amide group are located in the ortho- or peri-position, R is a substituted divalent aromatic radical, $R^1$ is a saturated aliphatic hydrocarbon, and $R^2$ is a substituent, and m is 0 or an integer from 1 to 4.

2. A material according to claim 1, wherein Z has the formula V, VI or VII

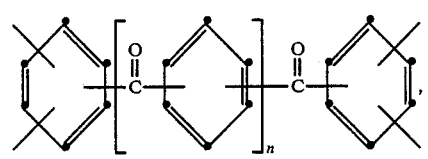
(V)

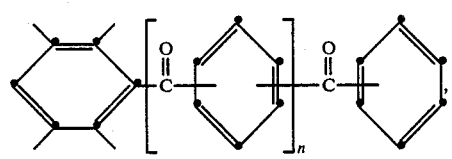
(VI)

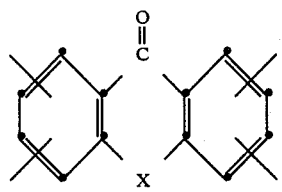
(VII)

wherein n is 0 or 1 and X is a direct bond, —CH$_2$—, —O—, —S—, —SO—, —SO$_2$—, —NR$^x$—, CR$^x$R$^y$— or —CO—, and the free bonds are located in the ortho-position, R$^x$ is hydrogen or C$_1$–C$_4$alkyl, phenyl, benzyl or cyclohexyl, and R$^y$ has the significance of R$^x$ but is not hydrogen.

3. A material according to claim 2, wherein Z has the formula

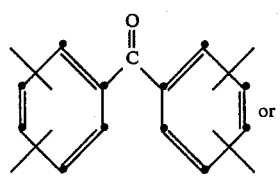 or

-continued

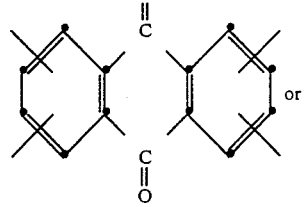 or

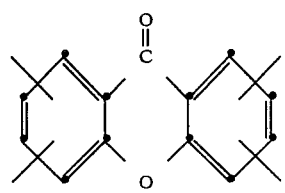

4. A material according to claim 1, wherein the radical of formula II has the formula

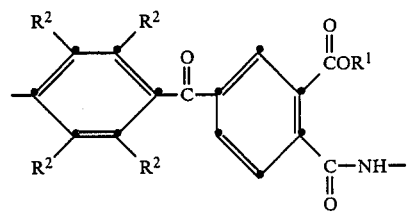

wherein $R^2$ is a hydrogen atom or methyl.

5. A material according to claim 1, wherein Z' in formula III has the formula

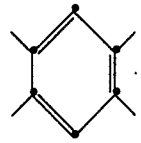

6. A material according to claim 1, wherein the radical of formula IV has the formula

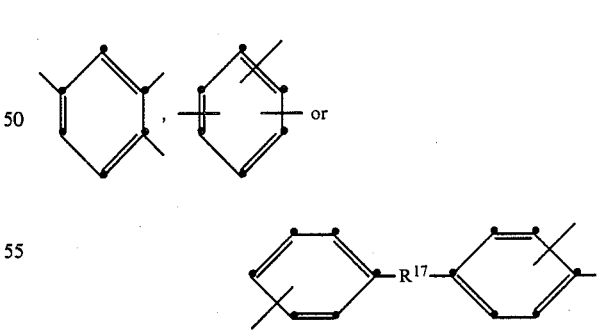

wherein $R^{17}$ is direct bond or a bridge, and the free bonds are in ortho-position.

7. A material according to claim 1, wherein $R^2$ is C$_1$–C$_4$alkyl and m is 1, 2, 3 or 4.

8. A material according to claim 1, wherein $R^1$ is unsubstituted or substituted, linear or branched alkyl, cycloalkyl or aralkyl.

9. A material according to claim 8, wherein $R^1$ is C$_1$–C$_{12}$alkyl, cycloalkyl of 5 or 6 ring carbon atoms or aralkyl containing 1 to 6 carbon atoms in the alkylene moiety.

10. A material according to claim 9, wherein $R^1$ is $C_1-C_4$alkyl or benzyl.

11. A material according to claim 1, wherein a substituted aromatic radical R contains 7 to 30 carbon atoms.

12. A material according to claim 1, wherein an aromatic radical R is a hydrocarbon radical or a pyridine radical, which is substituted by alkyl, alkoxy, alkoxyalkyl, trimethylene or tetramethylene.

13. A material according to claim 12, wherein an aromatic radical R is substituted by alkyl, alkoxy or alkoxyalkyl, each of 1 to 6 carbon atoms, or two adjacent carbon atoms of the aromatic radical are substituted by trimethylene or tetramethylene.

14. A material according to claim 13, wherein one or two of the substituents are located ortho to the —NH— group in formula I.

15. A material according to claim 12, wherein the aromatic radical has the formula

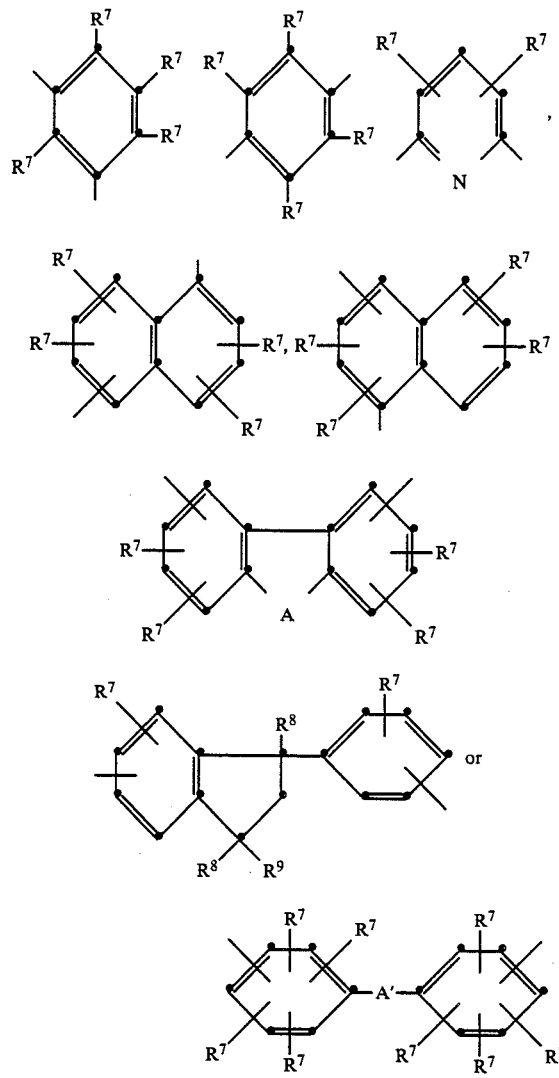

wherein each $R^7$ is a hydrogen atom and, in the case of monosubstitution, one substituent $R^7$ is alkyl of 1 to 6 carbon atoms and the other substituents $R^7$ are hydrogen, and in the case of di-, tri- or tetra-substitution, two substituents $R^7$ are alkyl of 1 to 6 carbon atoms and the other substituents $R^7$ are hydrogen atoms or alkyl of 1 to 6 carbon atoms, or in the case of di-, tri- or tetra-substitution, two vicinal substituents $R^7$ in the phenyl ring are trimethylene or tetramethylene and the other substituents $R^7$ are hydrogen atoms or alkyl of 1 to 6 carbon atoms, A is O, S, NH, CO or $CH_2$, $R^8$ is a hydrogen atom or alkyl of 1 to 5 carbon atoms, $R^9$ is alkyl of 1 to 5 carbon atoms and A' is a direct bond, O, S, SO, $SO_2$, CO,

$NR^{10}$, CONH, NH, $R^{10}SiR^{11}$, $R^{10}OSiOR^{11}$, alkylene of 1 to 6 carbon atoms, alkenylene or alkylidene of 2 to 6 carbon atoms, phenylene or phenyldioxy, in which $R^{10}$ and $R^{11}$ are each independently of the other alkyl of 1 to 6 carbon atoms or phenyl.

16. A material according to claim 15, wherein the aromatic radical has the formula

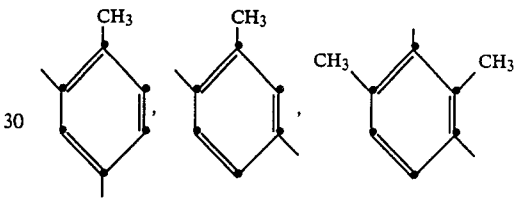

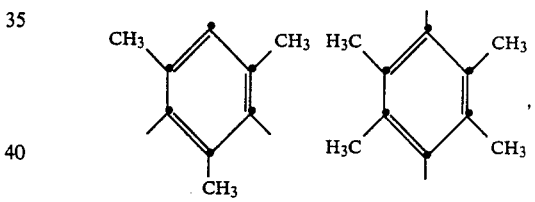

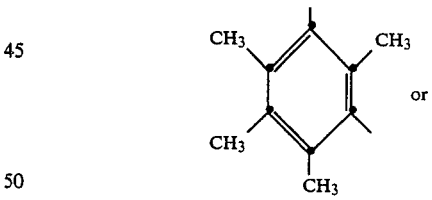

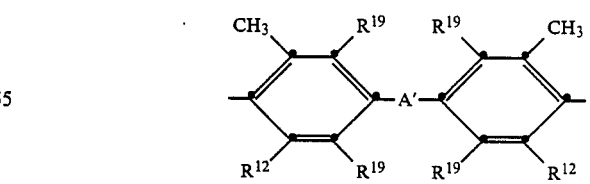

wherein A' is a direct bond, O or $CH_2$, $R^{12}$ is a hydrogen atom, methyl or ethyl, and $R^{19}$ is a hydrogen atom, methyl or ethyl.

17. A material according to claim 1, wherein 50 mol.% of component (a) or (b) is replaced by the corresponding polyamic acid.

* * * * *